(12) United States Patent
Pride

(10) Patent No.: US 8,688,407 B2
(45) Date of Patent: Apr. 1, 2014

(54) METHOD, DEVICE AND COMPUTER PROGRAM PRODUCT FOR MAGNETIC TAMPER DETECTION IN A METER

(75) Inventor: Bruce Michael Pride, Wells, ME (US)

(73) Assignee: General Electric Company, Schenectady, NY (US)

(*) Notice: Subject to any disclaimer, the term of this patent is extended or adjusted under 35 U.S.C. 154(b) by 375 days.

(21) Appl. No.: 12/948,986

(22) Filed: Nov. 18, 2010

(65) Prior Publication Data

US 2012/0130681 A1    May 24, 2012

(51) Int. Cl.
  *H03F 1/26* (2006.01)
  *G01R 33/00* (2006.01)
  *G08B 13/08* (2006.01)
  *H02B 1/00* (2006.01)

(52) U.S. Cl.
  USPC ............ 702/189; 324/260; 340/547; 361/672

(58) Field of Classification Search
  USPC ......... 702/189, 57, 60–62, 64–66, 70–71, 73, 702/81, 84, 108, 115, 117, 127, 182–183, 702/188, 190; 324/200, 207.2, 207.24, 228, 324/232, 239, 260, 262; 340/541, 551–552, 340/547, 568.1, 571, 870.01–870.03; 361/1, 52, 56, 78–79, 86, 143, 146, 361/159, 170, 600–601, 659, 672
  See application file for complete search history.

(56) References Cited

U.S. PATENT DOCUMENTS

| | | | |
|---|---|---|---|
| 6,885,302 B2 | 4/2005 | Seal et al. | |
| 7,218,223 B2 | 5/2007 | Seal et al. | |
| 8,344,881 B1* | 1/2013 | Hays | 340/540 |
| 2004/0021568 A1* | 2/2004 | Seal et al. | 340/551 |
| 2007/0229256 A1 | 10/2007 | Seal et al. | |
| 2008/0143525 A1 | 6/2008 | Woodbury et al. | |

FOREIGN PATENT DOCUMENTS

| | | |
|---|---|---|
| GB | 2 391 948 A | 2/2004 |
| JP | 2009 050478 A | 3/2009 |
| WO | 2004/017077 A1 | 2/2004 |
| WO | WO 2007039780 A1 * | 4/2007 |

OTHER PUBLICATIONS

New Zealand Office Action issued in connection with NZ Patent Application No. 596475, Nov. 23, 2011.
Search Report issued in connection with EP Patent Application No. 11189260.0, Apr. 5, 2012.

* cited by examiner

*Primary Examiner* — Toan Le
(74) *Attorney, Agent, or Firm* — Fletcher Yoder, P.C.

(57) ABSTRACT

Described herein are embodiments of methods, devices and computer program products for tamper detection in a meter. One aspect of the method includes using a magnetic field strength sensor to continuously detect magnetic field strength proximate to a meter. In one aspect, the magnetic field strength sensor produces an analog voltage signal proportional to the detected magnetic field strength. The analog voltage signal of the sensor is continuously converted to a digital voltage signal. The digital voltage signal is stored in a memory at timed intervals, and the digital voltage signal is monitored for an aberration that indicates tampering of the meter. If tampering is detected, then an alarm is triggered to indicate the tampering.

17 Claims, 5 Drawing Sheets

METHOD, DEVICE AND COMPUTER PROGRAM PRODUCT FOR MAGNETIC TAMPER DETECTION IN A METER

BACKGROUND OF THE INVENTION

In many instances, utility meters that measure utility service consumption are still read by hand, which can be costly, inefficient and error-prone. In some instances, utility providers desire to electronically communicate with the meters for numerous purposes including scheduling disconnection or connection of utility services to the metered loads, automatic meter reading (AMR), load shedding and load control, automatic distribution and smart-grid applications, outage reporting, providing additional services such as Internet, video, and audio, etc. In many of these instances, the meters must be configured to communicate with one or more computing devices through a communications network, which can be wired, wireless or a combination of wired and wireless, as known to one of ordinary skill in the art.

However, the use of AMR and other forms of remote metering impairs the opportunity for utility representatives to physically inspect the meter for tampering. For example, tampering with electronic power meters via magnetic field saturation has become a common method of reducing the power measurements read by the electronic power meter. By placing a magnet near the meter (approximately 600 Gauss or larger), current transformers of an electric utility meter can become saturated by the external magnetic field and the end result is a reduction in the Kilowatt/Hour (KWH) measurement. Furthermore, even low levels of magnetic field proximate to the meter can reduce KWH measurements and lead to significant reductions in revenue to the utility over time. Unfortunately, this type of tampering cannot generally be detected remotely. U.S. Pat. No. 7,218,223 describes a system that can be used to detect a strong magnet placed on or near a meter; however, this system requires multiple sensors and setting a threshold magnetic level for each sensor. Furthermore, the system described in the '223 patent records only events that exceed the threshold and may not detect low levels of magnetic field that do not exceed the threshold.

Therefore, what is desired is a meter configured to have capabilities beyond that of mere measurement of utility service consumption and that overcome challenges present in the art, some of which are described above.

BRIEF DESCRIPTION OF THE INVENTION

Described herein are embodiments of methods, devices and computer program products of a meter comprising magnetic tamper detection. In general, embodiments of the present invention provide an improvement over current methods of magnetic tamper detection in a meter by providing a method of recording digital voltage signals representative of magnetic field strength that can be used to determine magnetic tampering.

One aspect of the method comprises using a magnetic field strength sensor to continuously detect magnetic field strength proximate to a meter. In one aspect, the magnetic field strength sensor produces an analog voltage signal proportional to the detected magnetic field strength. The analog voltage signal of the sensor is continuously converted to a digital voltage signal. The digital voltage signal is stored in a memory on an intermittent basis, and the digital voltage signal is monitored for an aberration that indicates tampering of the meter. If tampering is detected, then an alarm is triggered to indicate the tampering.

Another aspect of the present invention comprises a utility service meter having magnetic tampering detection. In one embodiment the utility service meter is comprised of a magnetic field strength sensor. The magnetic field strength sensor detects magnetic field strength proximate to the meter and continuously produces an analog voltage signal proportional to the detected magnetic field strength. The meter is further comprised of at least one analog-to-digital converter (ADC). The ADC continuously receives the analog voltage signal proportional to the detected magnetic field strength and converts the analog voltage signal into a digital voltage signal. Further comprising the meter is a memory and one or more processors. The one or more processors are configured to intermittently store said digital voltage signal in the memory and to monitor the digital voltage signal for an aberration. If the aberration indicates tampering of the meter than an alarm can be triggered to indicate the tampering.

Yet another aspect of the present invention comprises a computer program product comprised of computer-executable code sections stored on a non-transitory computer-readable medium. The computer-executable code sections comprise a first section for intermittently storing digital voltage signals in a memory. The digital voltage signals represent magnetic field strength proximate to a meter as continuously detected by a magnetic field strength sensor that produces an analog voltage signal proportional to the detected magnetic field strength. The analog voltage signal is continuously converted into the digital voltage signal. A second computer-executable code section is provided for monitoring the digital voltage signal for an aberration, wherein the aberration indicates tampering of the meter, and a third computer-executable code section is provided for triggering an alarm to indicate detected tampering.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION OF THE INVENTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1:
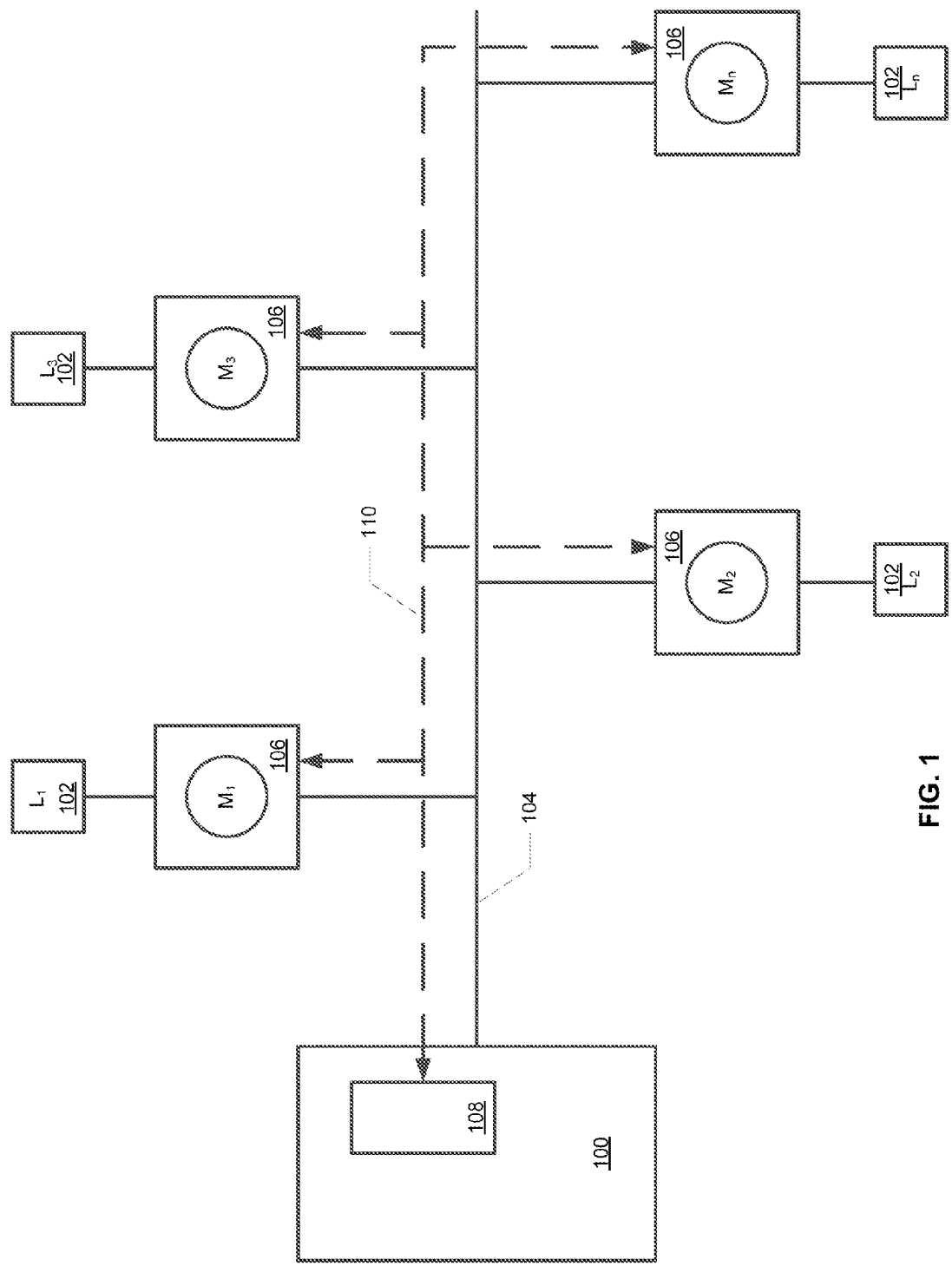
FIG. 1 is a block diagram of a section of an exemplary utility distribution system.
Figure 2:
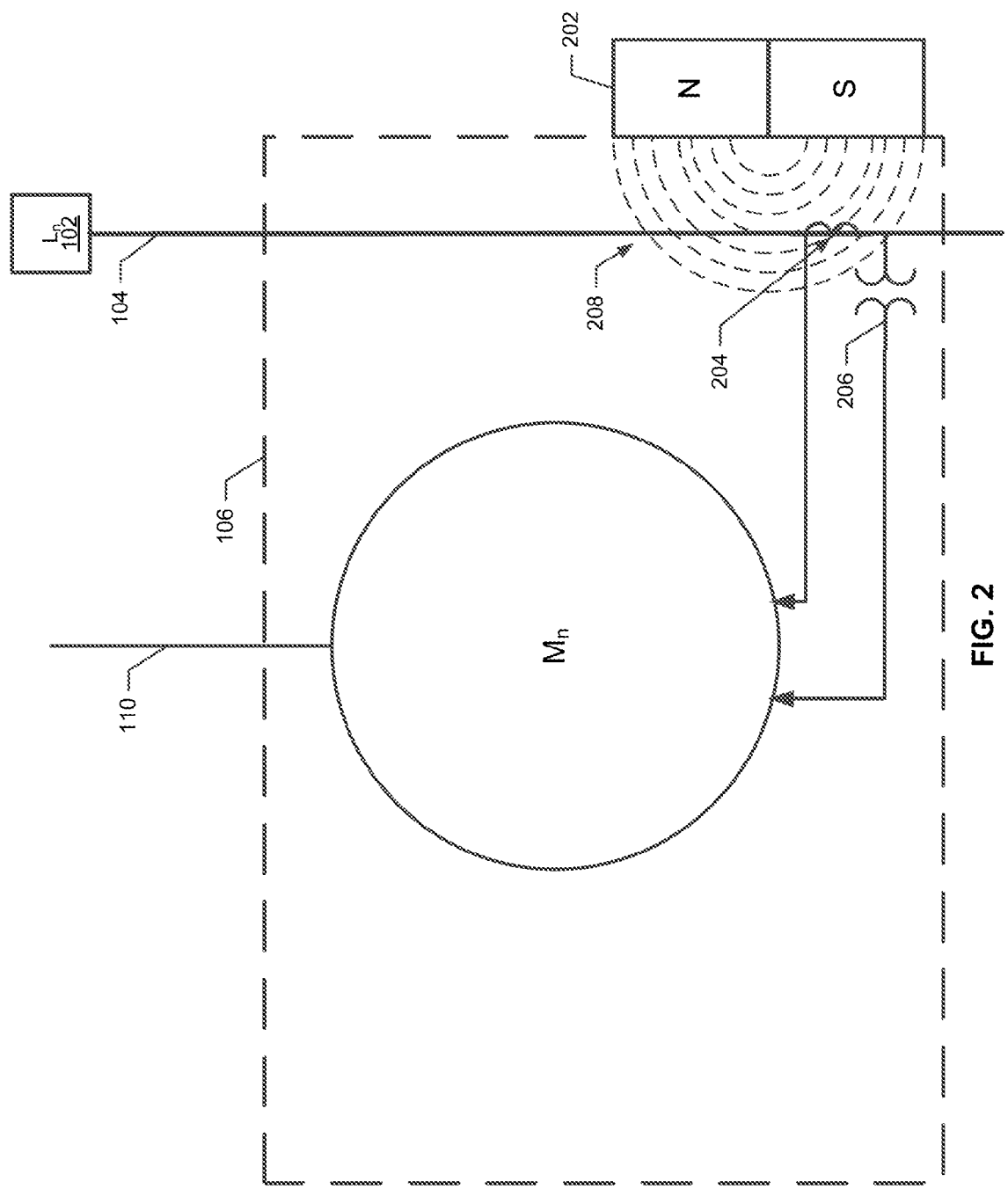
FIG. 2 illustrates an overview block diagram of an embodiment of a utility service meter wherein a magnet has been placed proximate to the meter such that current transformers and potential transformers of the meter can be affected by the external magnetic field resulting in a reduction of the Kilowatt/Hour (KWH) measurement.

Referring to FIG. 1, an illustration of one type of system that would benefit from embodiments of the present invention is provided. FIG. 1 is a block diagram of a section of an exemplary utility distribution system such as, for example, an electric, water or gas distribution system. However, while embodiments of the present invention can be used to benefit any meter that uses magnetics (e.g., current transformers) to measure a delivered service or product, the embodiments described herein are most readily applicable as applied toward electric utility meters used to measure electric power and demand. As shown in FIG. 1, a utility service is delivered by a utility provider 100 to various loads $L_1$-$L_n$ 102 through a distribution system 104. In one aspect, the utility service provided is electric power. Consumption and demand by the loads 102 can be measured at the load locations by meters $M_1$-$M_n$ 106. If an electric meter, the meters 106 can be single-phase or poly-phase electric meters, as known to one of ordinary skill in the art, depending upon the load 102. While consumption or demand information is used by the utility provider 100 primarily for billing the consumer, it also can be used for other purposes including planning and profiling the utility distribution system. In many instances, meters 106 are still read by hand, which can be costly, inefficient and error-prone. In some instances, utility providers 100 desire to electronically communicate with the meters 106 for numerous purposes including scheduling disconnection or connection of utility services to the loads 102, automatic meter reading (AMR), load shedding and load control, automatic distribution and smart-grid applications, outage reporting, providing additional services such as Internet, video, and audio, etc. In many of these instances, the meters 106 must be configured to communicate with one or more computing devices 108 through a communications network 110, which can be wired, wireless or a combination of wired and wireless, as known to one of ordinary skill in the art. While such systems have made the process of meter reading and billing more efficient, they have reduced the opportunities for utility representatives to physically inspect the meters 106 for tampering. For example, tampering with electronic power meters 106 via magnetic field saturation has become a common method of reducing the power measurements read by the electronic power meter. As shown in FIG. 2, by placing a magnet 202 (approximately 600 Gauss or larger) proximate the meter 106, current transformers 204 (and potential transformers 206) of an electric utility meter 106 can become saturated or partially saturated by the external magnetic field 208 and the end result can be a reduction in the Kilowatt/Hour (KWH) measurement. Furthermore, even low levels of magnetic field 208 proximate to the meter 106 can reduce KWH measurements and lead to significant reductions in revenue to the utility over time. Therefore, it is desired that the meters 106 of a system such as that shown in FIGS. 1 and 2 are configured to have capabilities beyond that of mere measurement of utility service consumption. Described herein are embodiments of methods, devices and computer program products of a utility service meter comprising magnetic tampering detection. In general, the technical effect of embodiments of the present invention provide an improvement over current methods of detecting magnetic tampering by providing a method of storing digital voltage information that is proportional to magnetic field 208 strength. In one aspect, this stored information can be used to determine whether magnetic tampering is occurring with the meter 106.

Figure 3:
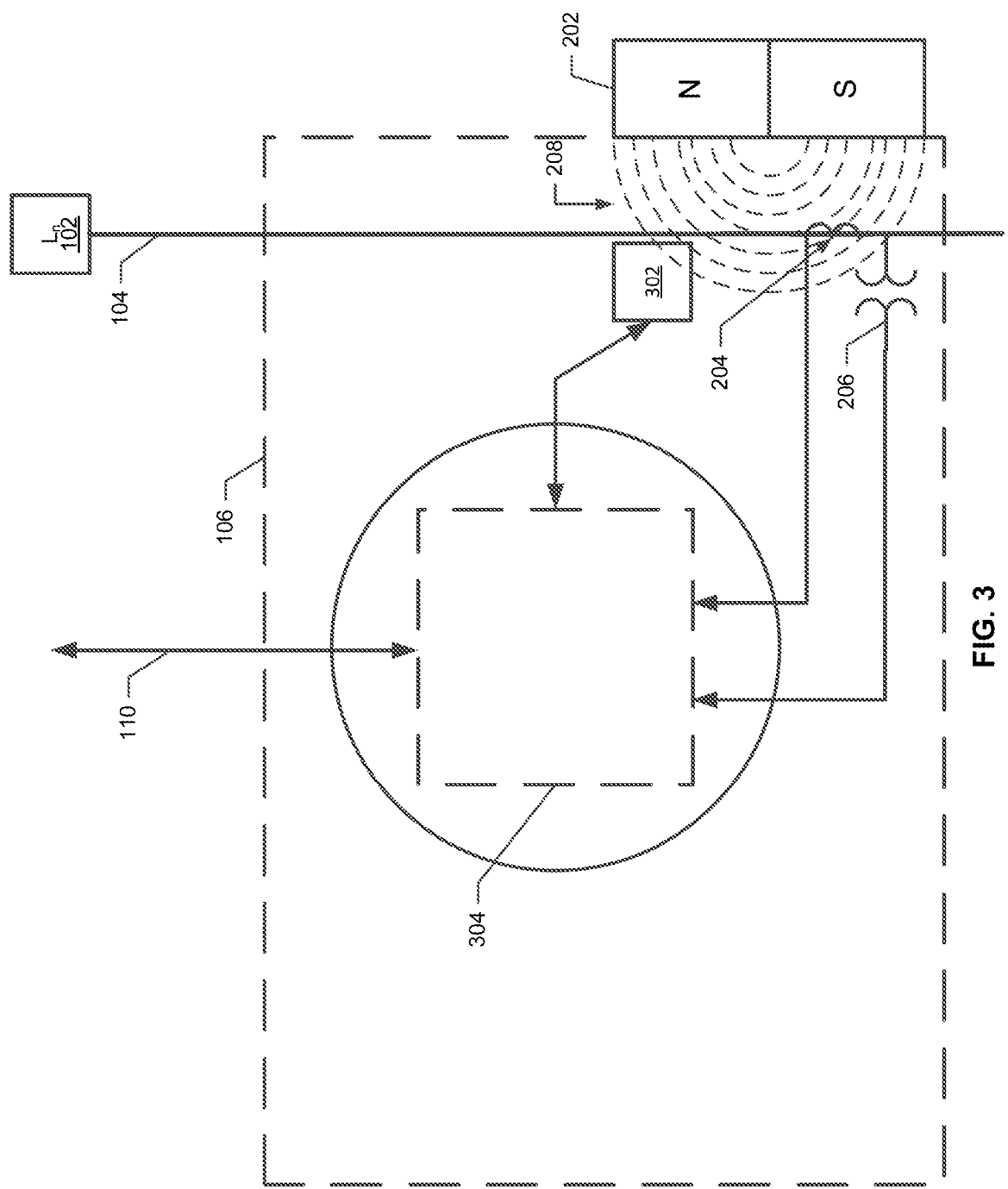
FIG. 3 illustrates an overview block diagram of an embodiment of a utility service meter comprising magnetic tamper detection.

FIG. 3 illustrates an embodiment of a meter 106 further comprising magnetic tamper detection. In one aspect, the magnetic tamper detection comprises a magnetic field strength sensor 302 and meter electronics 304. In one aspect, the magnetic field strength sensor 302 detects magnetic field 208 strength proximate to a meter 106 and continuously produces an analog voltage signal proportional to the detected magnetic field 208 strength. For example, in one instance the magnetic field strength sensor 302 can produce an output analog voltage signal of 2.5 mV/Gauss. In another non-limiting example, the magnetic field strength sensor can produce an output analog voltage signal of 1.3 mV/Gauss. In one aspect, the magnetic field strength sensor 302 comprises a ratiometric Hall effect sensor. In one aspect, the analog voltage signal produced by the magnetic field strength sensor 302 is linearly proportional to the detected magnetic field 208 strength. Non-limiting examples of magnetic field strength sensors that can be used to practice embodiments of the present invention include A1301 and A1302 continuous-time ratiometric linear Hall effect sensors as are available from Allegro MicroSystems, Inc. (Worcester, Mass.).

Further comprising the embodiment of FIG. 3 are the meter's 106 electronics 304. In one aspect, the electronics 304 comprise at least one analog-to-digital converter (ADC), a memory, and one or more processors. In one aspect, the ADC continuously receives the analog voltage signal proportional to the detected magnetic field strength and converts the analog voltage signal into a digital voltage signal. In one aspect, the meter electronics 304 can comprise a metering micro-controller as used by the meter 106. Non-limiting examples of acceptable metering micro-controllers (having ADCs) include a Teridian 6533 controller or a Teridian 6521 controller, as are available from Maxim Integrated Products, Inc. (Sunnyvale, Calif.), among others.

Figure 4:
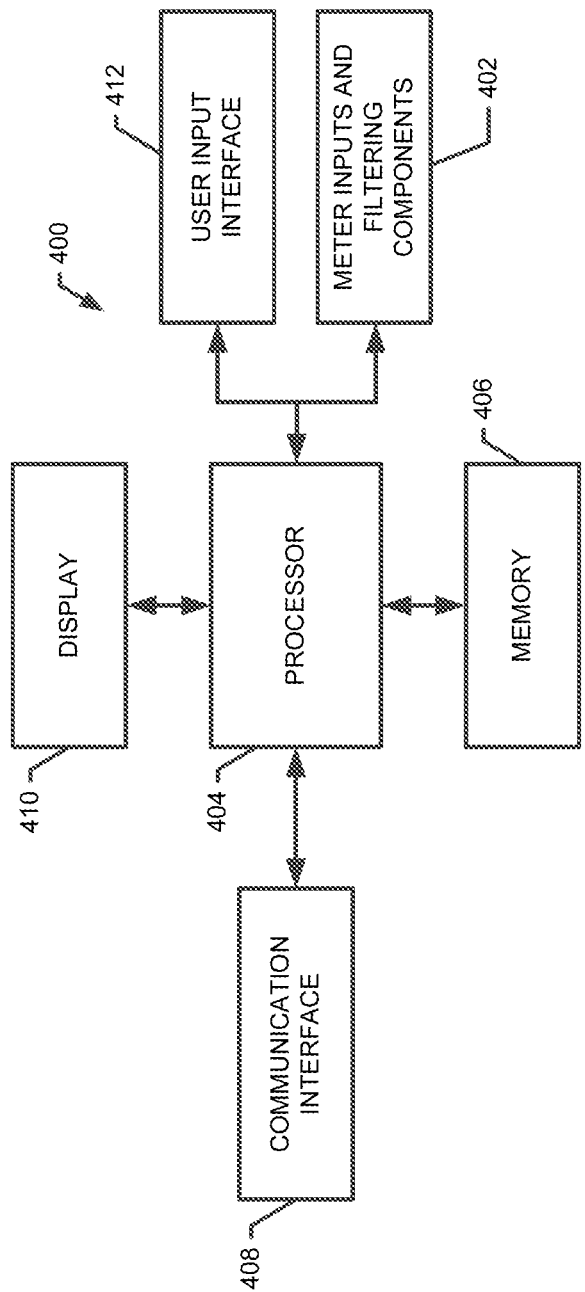
FIG. 4 illustrates a block diagram of an entity capable of operating as a meter micro-controller in accordance with one embodiment of the present invention.

Referring now to FIG. 4, a block diagram of an entity capable of operating as a meter micro-controller 400 is shown in accordance with one embodiment of the present invention. The entity capable of operating as a meter micro-controller 400 includes various means for performing one or more functions in accordance with embodiments of the present invention, including those more particularly shown and described herein. It should be understood, however, that one or more of the entities may include alternative means for performing one or more like functions, without departing from the spirit and scope of the present invention. As shown, the entity capable of operating as a meter micro-controller 400 can generally include means, such as one or more processors 404 for performing or controlling the various functions of the entity. As shown in FIG. 4, in one embodiment a micro-controller 400 can comprise meter inputs and filtering components 402. In one aspect, the meter inputs and filter components 402 can comprise voltage and current inputs, one or more ADCs, and filtering components. Further comprising this embodiment of a micro-controller 400 is a processor 404 and memory 406 (collectively, the processor 404 and memory 406 can be referred to as firmware). As known to one of ordinary skill in the art, an ADC converts input analog signals into digital signals. In one aspect, the ADC continuously receives the analog voltage signal proportional to the detected magnetic field 208 strength and continuously converts the analog voltage signal into a digital voltage signal. In one aspect, at timed intervals (e.g., once every 30 seconds, once a minute, once every two minutes, etc.) the processor 404 reads the analog output voltage of the magnetic field strength sensor 302 as converted into a digital voltage signal by the ADC and stores the digital voltage signal in the memory 406, thereby creating a plurality of stored digital voltage signals over a period of time.

In one embodiment, the one or more processors 404 are in communication with or include memory 406, such as volatile and/or non-volatile memory that stores content, data or the like. For example, the memory 406 may store content transmitted from, and/or received by, the entity. Also for example, the memory 406 may store software applications, instructions or the like for the processor to perform steps associated with operation of the entity in accordance with embodiments of the present invention. In particular, the one or more processors 404 may be configured to perform the processes discussed in more detail herein for detecting magnetic tampering of a meter 106. For example, according to one embodiment the one or more processors 404 can be configured to intermittently store digital voltage signals representative of the magnetic field 208 strength in the memory 406. Furthermore, the processor 404 can be configured to monitor the digital voltage signals for an aberration, wherein the aberration can indicate tampering of the meter 106. In one aspect, the one or more processors 404 can be configured to determine an average for the stored digital voltage signals. An aberration can occur when a digital voltage signal deviates from the average. As non-limiting examples, the processor 404 can be configured to determine an aberration when a determined digital voltage signal deviates from the average by plus or minus one percent, plus or minus two percent, plus or minus five percent, plus or minus 10 percent, plus or minus 15 percent, plus or minus 50 percent, plus or minus 100 percent, etc., or any value therebetween. In one aspect, the processor 404 is configured to determine a rolling average of the stored digital voltage signals. In one aspect, the one or more processors 404 are configured to determine a rolling average over a defined time window. For example, a time window of approximately 30 minutes can be defined and the average can be determined from any digital voltage signals stored in the memory 406 during that 30-minute window. Time windows of larger or smaller duration are also contemplated within the scope of embodiments of the present invention. Once determined, the rolling average can be used to determine any digital signals that deviate from the rolling average and thus may indicate an aberration and possible tampering. In one aspect, the time window and bounds for aberration detection can be pre-set on the processor 404 before the meter 106 is installed.

In one aspect, detection of an aberration can be used to trigger an alarm to indicate tampering. In one example, an alarm is triggered after the alarm occurs continuously over a defined time period. This aspect can help avoid spurious alarms. For example, in various instances the aberration may occur for 10 minutes, 20 minutes, one hour, two hours, six hours, etc., or any value therebetween, before an alarm is triggered. In one aspect, the defined time period for an aberration to trigger an alarm can be pre-set on the processor 404 before the meter 106 is installed. In one aspect, triggering an alarm can comprise triggering a mechanical or electromechanical alarm at the meter 106. For instance, a flag or target can become visible in a window of the meter 106 to indicate tampering. In one aspect, the target or flag can be of a designated color (i.e., red, yellow, orange, etc.) to indicate tampering. In one aspect, one or more lights can be illuminated or darkened to indicate tampering of the meter 106. In one aspect, the lights can be of various colors (e.g., red, yellow, orange, etc.) to indicate tampering. In one aspect, an alarm can be triggered by transmitting a signal to a remote location. For example, in one instance the processor 404 can cause a communication interface 408 to communicate an alarm with one or more computing devices 108 through a communications network 110.

In addition to the memory 406, the one or more processors 404 can also be connected to at least one interface or other means for displaying, transmitting and/or receiving data, content or the like. In this regard, the interface(s) can include at least one communication interface 408 or other means for transmitting and/or receiving data, content or the like, as well as at least one user interface that can include a display 410 and/or a user input interface 412. In one aspect, the communication interface 108 can be used to transfer at least a portion of the digital voltage signals stored in the memory 406 to a remote computing device. For example, in one instance the communication interface 408 can be used to transfer at least a portion of the stored digital voltage signals to a computing device 108 over a communication network 110 so that the transferred digital voltage signals can be analyzed for changes in the magnetic field strength proximate to the meter. The user input interface 412, in turn, can comprise any of a number of devices allowing the entity to receive data from a user, such as a keypad, a touch display, a joystick or other input device.

Figure 5:
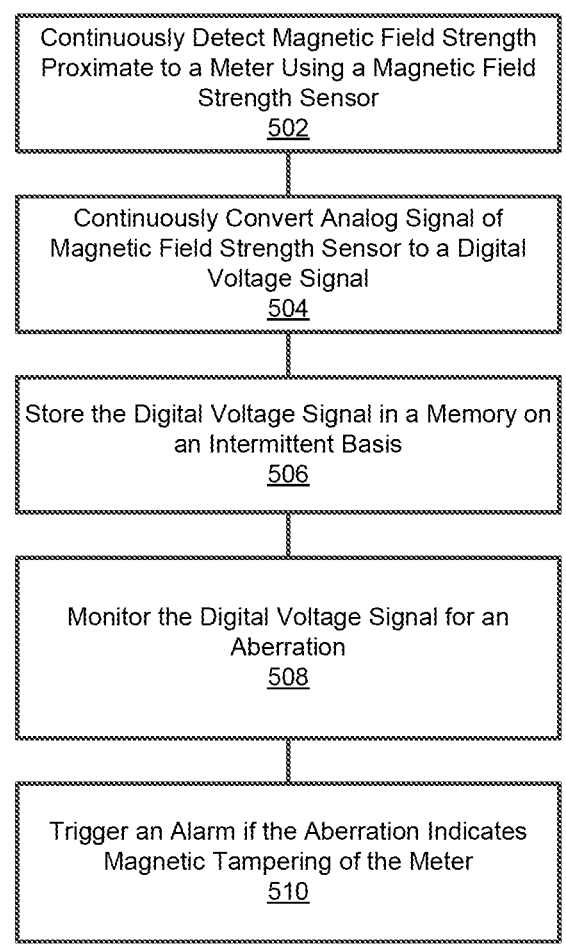
FIG. 5 is a flowchart illustrating the operations taken in order to detect magnetic tampering in a meter.

Referring now to FIG. 5, the operations are illustrated that may be taken in order to detect magnetic tampering in a meter. At step 502, a magnetic field strength sensor continuously detects magnetic field strength proximate to a meter. In one aspect, the magnetic field strength sensor continuously produces an analog voltage signal that is proportional to the detected magnetic field strength. In one aspect, the magnetic field strength sensor comprises a ratiometric Hall effect sensor. In one aspect, the analog voltage signal produced by the magnetic field strength sensor is linearly proportional to the detected magnetic field strength. At step 504, the analog voltage signal produced by the magnetic field strength sensor is continuously converted into a digital voltage signal. In one aspect, as described herein, the analog signal is converted to a digital signal by an ADC. At step 506, the digital voltage signal is stored in a memory on an intermittent basis. A processor in the meter performs this process. This process creates a plurality of stored digital voltage signals in the memory. At step 508, the digital voltage signal is monitored for an aberration. An aberration can indicate tampering of the meter. In one aspect, monitoring the digital voltage signal for an aberration comprises determining an average for the stored digital voltage signals and the aberration comprises a deviation of the digital voltage signal from the average. In one aspect, the determined average is a rolling average determined over a defined time window. If the aberration indicates tampering, then at step 510 an alarm is triggered. In one aspect, triggering an alarm to indicate tampering comprises triggering the alarm when said aberration occurs continuously over a defined time period. As described herein, triggering an alarm to indicate tampering can comprise, for example, triggering a mechanical alarm at the meter, triggering an electromechanical alarm at the meter, or triggering an electronic signal transmitted to a remote location.

As described above and as will be appreciated by one skilled in the art, embodiments of the present invention may be configured as a system, method, or computer program product. Accordingly, embodiments of the present invention may be comprised of various means including entirely of hardware, entirely of software, or any combination of software and hardware. Furthermore, embodiments of the present invention may take the form of a computer program product on a computer-readable storage medium having computer-readable program instructions (e.g., computer software) embodied in the storage medium. Any suitable non-transitory computer-readable storage medium may be utilized including hard disks, CD-ROMs, optical storage devices, or magnetic storage devices.

Embodiments of the present invention have been described above with reference to block diagrams and flowchart illustrations of methods, apparatuses (i.e., systems) and computer program products. It will be understood that each block of the block diagrams and flowchart illustrations, and combinations of blocks in the block diagrams and flowchart illustrations, respectively, can be implemented by various means including computer program instructions. These computer program instructions may be loaded onto a general purpose computer, special purpose computer, or other programmable data processing apparatus, such as the one or more processors 404 discussed above with reference to FIG. 4, to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus (e.g., one or more processors 404 of FIG. 4) to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

Many modifications and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method for tamper detection in a meter comprising:
   continuously detecting, using a magnetic field strength sensor, magnetic field strength proximate to a meter, wherein the magnetic field strength sensor produces an analog voltage signal proportional to the detected magnetic field strength;

continuously converting the analog voltage signal to a digital voltage signal;

storing, using a processor, the digital voltage signal in a memory on an intermittent basis, resulting in a plurality of stored digital voltage signals in the memory; and monitoring the plurality of stored digital voltage signals in the memory for an aberration in one or more of the plurality of stored digital voltage signals, wherein the aberration can indicate tampering of the meter, monitoring the plurality of stored digital voltage signals for an aberration comprises determining an average for the plurality of stored digital voltage signals, and the aberration comprises a deviation of the digital voltage signal from the average.

2. The method of claim 1, wherein continuously detecting, using a magnetic field strength sensor, magnetic field strength proximate to a meter, wherein the magnetic field strength sensor produces an analog voltage signal proportional to the detected magnetic field strength comprises using a ratiometric Hall effect sensor to detect the magnetic field strength proximate to the meter.

3. The method of claim 2, wherein the analog voltage signal produced by the magnetic field strength sensor is linearly proportional to the detected magnetic field strength.

4. The method of claim 1, wherein the determined average is a rolling average determined over a defined time window.

5. The method of claim 1, wherein the aberration comprises the digital voltage signal deviating from the average by about +/−10 percent.

6. The method of claim 1, further comprising triggering an alarm to indicate tampering, wherein triggering an alarm to indicate tampering comprises triggering the alarm when the aberration occurs continuously over a defined time period.

7. The method of claim 1, further comprising triggering an alarm to indicate tampering, wherein triggering an alarm to indicate tampering comprises triggering an alarm selected from the group consisting of triggering a mechanical alarm at the meter, triggering an electromechanical alarm at the meter, and triggering an electronic signal transmitted to a remote location.

8. The method of claim 1, further comprising transferring at least a portion of the stored digital voltage signals to a computing device, wherein the transferred digital voltage signals can be analyzed for changes in the magnetic field strength proximate to the meter.

9. A utility service meter comprising magnetic tampering detection, the utility service meter comprising:

a magnetic field strength sensor, wherein the magnetic field strength sensor detects magnetic field strength proximate to a meter and continuously produces an analog voltage signal proportional to the detected magnetic field strength;

at least one analog-to-digital converter (ADC), wherein the ADC continuously receives the analog voltage signal proportional to the detected magnetic field strength and converts the analog voltage signal into a digital voltage signal;

a memory; and one or more processors, wherein the one or more processors are configured to:

intermittently store the digital voltage signal in the memory, resulting in a plurality of stored digital voltage signals in the memory;

monitor the plurality of stored digital voltage signals for an aberration, wherein the aberration indicates tampering of the meter;

determine an average for the stored digital voltage signals, wherein the aberration comprises a deviation of the digital voltage signal from the average; and trigger an alarm to indicate tampering, wherein tampering involves the aberration occurring over a defined time period.

10. The utility service meter of claim 9, wherein the magnetic field strength sensor comprises a ratiometric Hall effect sensor.

11. The utility service meter of claim 10, wherein the analog voltage signal produced by the magnetic field strength sensor is linearly proportional to the detected magnetic field strength.

12. The utility service meter of claim 9, wherein the one or more processors are configured to determine a rolling average over a defined time window.

13. The utility service meter of claim 9, wherein the one or more processors configured to monitor the digital voltage signal for an aberration are configured to determine that one or more digital voltage signals deviate from the average by about +/−10 percent.

14. The utility service meter of claim 9, wherein the one or more processors are configured to trigger an alarm to indicate tampering, wherein the one or more processors are configured to trigger an alarm selected from the group consisting of a mechanical alarm at the meter, an electromechanical alarm at the meter, and an electronic signal transmitted to a remote location.

15. The utility service meter of claim 9, wherein the one or more processors are further configured to transfer at least a portion of the plurality of stored digital voltage signals to a computing device, wherein the transferred digital voltage signals can be analyzed for changes in the magnetic field strength proximate to the meter.

16. A computer program product comprised of computer-executable code stored on a non-transitory computer-readable medium, the computer-executable code comprising instructions to:

intermittently store one of a plurality of digital voltage signals in a memory, wherein the plurality of digital voltage signals represent magnetic field strength values proximate to a meter as continuously detected by a magnetic field strength sensor that produces an analog voltage signal proportional to the detected magnetic field strength that is continuously converted into a digital voltage signal;

monitor the digital voltage signal for an aberration, wherein the aberration indicates tampering of the meter;

determine an average for the plurality of digital voltage signals;

and compare the one of the plurality of digital voltage signals to the average, wherein the aberration comprises a deviation of the one of the plurality of digital voltage signals from the average of the plurality of digital voltage signals.

17. The computer program product of claim 16, wherein the computer-executable code comprises instructions to trigger an alarm to indicate tampering, wherein the alarm is triggered after the aberration occurs continuously over a defined period of time.

* * * * *